(12) United States Patent
Tabler

(10) Patent No.: US 6,466,149 B2
(45) Date of Patent: Oct. 15, 2002

(54) APPARATUS AND METHOD FOR DIGITAL TO ANALOG CONVERSION

(75) Inventor: John A. Tabler, San Jose, CA (US)

(73) Assignee: Summit Microelectronics Inc., Campbell, CA (US)

( * ) Notice: Subject to any disclaimer, the term of this patent is extended or adjusted under 35 U.S.C. 154(b) by 0 days.

(21) Appl. No.: 09/752,226

(22) Filed: Dec. 29, 2000

(65) Prior Publication Data

US 2002/0121995 A1 Sep. 5, 2002

(51) Int. Cl.[7] .............................................. H03M 1/66
(52) U.S. Cl. ........................ 341/144; 341/138; 341/153; 341/154
(58) Field of Search ................................ 341/144, 153, 341/154, 138

(56) References Cited

U.S. PATENT DOCUMENTS

| 3,997,892 | A | * | 12/1976 | Susset | 340/347 |
|---|---|---|---|---|---|
| 4,168,528 | A | * | 9/1979 | Comer | 364/606 |
| 5,748,128 | A | * | 5/1998 | Bruccoleri et al. | 341/144 |
| 5,798,724 | A | * | 8/1998 | Myers | 341/146 |
| 6,154,121 | A | * | 11/2000 | Cairns et al. | 340/347 |
| 6,166,672 | A | * | 12/2000 | Park | 341/145 |
| 6,252,534 | B1 | * | 6/2001 | Timko | 341/145 |

* cited by examiner

Primary Examiner—Michael Tokar
Assistant Examiner—Khai M. Nguyen
(74) Attorney, Agent, or Firm—Fernandez & Associates LLP

(57) ABSTRACT

The invention includes a segmented digital-to-analog converter (DAC) processing an N-bit input digital signal. A first segment converter processes the most significant bits and subsequent segment converters process the least significant bits of the N-bit input digital signal. The first segment converter includes ballast resistors that nullify the effect of any imbalance of the resistance of the first segment DAC versus the sum of the resistances in the remaining segment DACs. The first segment may be a 2, 4, 6, 8 or higher bit DAC while the second or subsequent segments may similarly be 2, 4, 6, 8, or higher bit DACs.

6 Claims, 4 Drawing Sheets

APPARATUS AND METHOD FOR DIGITAL TO ANALOG CONVERSION

BACKGROUND OF INVENTION

1. Field of Invention

Invention relates to digital-to-analog converters (DACs) and more particularly to digital-to-analog converters with cascading segments.

2. Description of Related Art

DACs are presently available to produce an analog voltage output by selectively tapping a resistor string connected between the high voltage reference and ground or the low voltage reference. However, once the resolution of the DAC is over six or eight bits, the number of components required is fairly high. For example, a 10-bit DAC of this topology would require 1024 resistors, 1024 switches, and 1024 logic drive lines. A DAC design that does not require the high number of elements is desirable as the silicon area needed for the circuit would be reduced which in turn would lower manufacturing costs.

Several DAC architectures have concentrated on cascading segments where a first segment includes a resistor string that produces a first voltage corresponding to the most significant bits (MSB) and the second segment includes a resistor string that produces a voltage corresponding to the least significant bits (LSB). The second segment uses the output voltage of the first segment of the DAC such that the second segment effectively interpolates the selected first segment voltage to correspond with the LSB. One such device is described in U.S. Pat. No. 3,997,892.

Other prior art approaches for cascaded segment converters suffer from linearity problems and other performance characteristics when applied to higher resolution DACs. Thus, there is a need for a DAC architecture that reduces the number of circuit components while achieving satisfactory linearity characteristics.

SUMMARY OF INVENTION

Invention resides in a cascading DAC design that achieves the reduction of the number of circuit components and maintains good performance characteristics. The present invention includes a segmented DAC architecture where the first segment DAC processes $N_1$ most significant bits of an N-Bit DAC and the subsequent segment DACs process the balance of the bits, $(N-N_1)$, of the N-bit input digital signal. The DAC architecture includes ballast resistors that nullify the effect of any imbalance of the resistance on the first segment DAC versus the sum of the resistances in the remaining segment DACs.

One embodiment involves a two-segment cascading design for a 10-Bit DAC where the first segment processes the two MSB and the second segment processes the eight LSB. In one application of the present invention, two 10-Bit DACs, with their associated circuits comprising a 10-Bit volatile data latch, a 10-Bit nonvolatile data register, and a unity gain operational amplifier, are integrated with a configuration register and a standard two-wire serial interface.

The present invention may have a first segment that is a 2, 4, 6, 8 or higher bit DAC while the second or subsequent segments may be 2, 4, 6, 8, or higher bit DACs and the principles and approach of the architecture would apply.

DETAILED DESCRIPTION OF PREFERRED EMBODIMENT(S)

Figure 1:
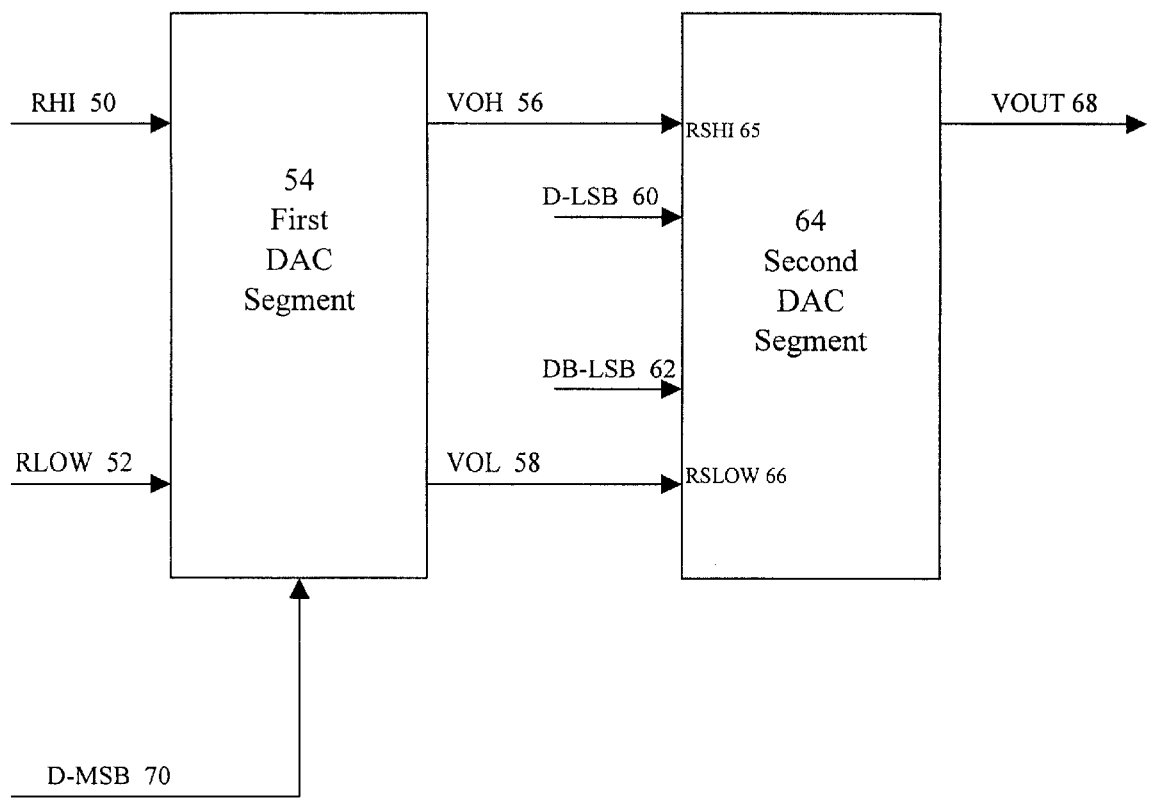
FIG. 1 is general schematic diagram of a segmented digital-to-analog converter according to one embodiment of the present invention.

FIG. 1 is general schematic diagram of a voltage-output segmented digital-to-analog converter (DAC) according to one embodiment of the present invention. A high voltage reference RHI 50 and a low voltage reference RLOW 52 are input to the first DAC segment 54. The most significant bits (MSB) of the input signal are selected by a decoder (not shown), and come in through D-MSB 70 into the first DAC segment 54. D-MSB 70 is used by the first DAC segment 54 to activate the switches based on the values of the MSB. A high voltage output VOH 56 and a low voltage output VOL 58 come out of the first DAC segment 54 and connect into the high input reference voltage RSHI 65 and the low input reference voltage RSLOW 66, respectively, of the second DAC segment 64. It should be noted that this segmented DAC architecture does not require a buffer amplifier between the first DAC segment and subsequent DAC segments. The least significant bits (LSB) of the input digital signal selected by the decoder become digital input to the second DAC segment 64 as input D-LSB 60 and DB-LSB 62. D-LSB 60 and DB-LSB 62 are used by the second DAC segment 64 to activate the switches based on the values of the LSB. The output voltage of the DAC is VOUT 68, which may go through a buffer amplifier (not shown), before being used by an application.

Figure 2:
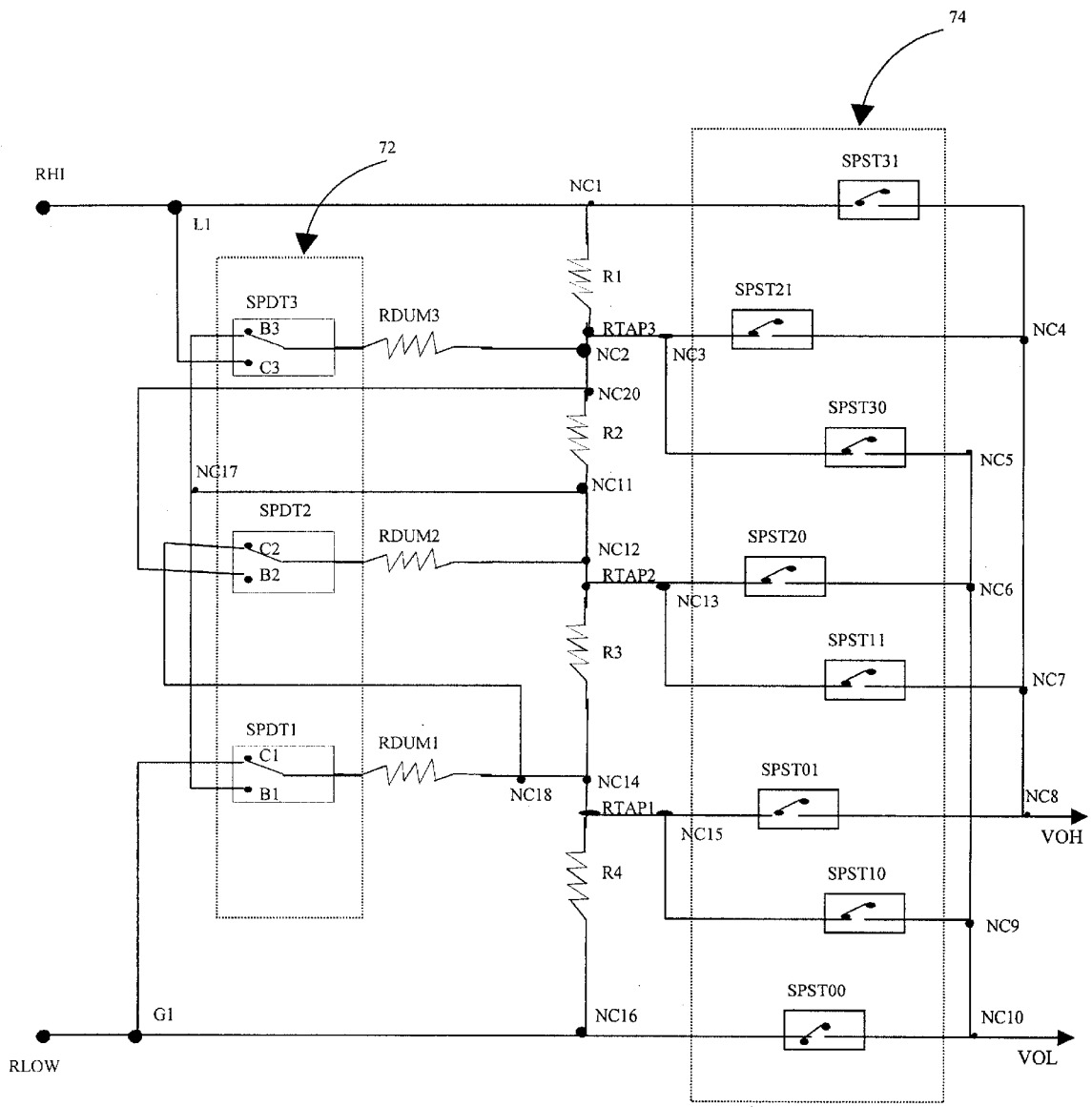
FIG. 2 is a more detailed circuit diagram of a first segment of a digital-to-analog converter according to one embodiment of the present invention.

FIG. 2 is a more detailed circuit diagram of the first DAC segment processing of a two-segment DAC according to one embodiment of the present invention. This diagram is for the first segment of a 10-Bit segmented DAC, the first segment being a 2-Bit DAC processing the MSB coupled to a second segment 8-Bit DAC processing the LSB. The first segment 2-Bit DAC processes bits 8 and 9 of the input digital signal and comprises a string of resistors, tap points for the output high voltage VOH, tap points for the output low voltage VOL, two switching networks, 72 and 78, and three ballast resistors, RDUM1, RDUM2, and RDUM3, for rectifying a mismatch between the resistance of the first segment DAC versus the resistance of the second segment DAC. The two switching networks are the switching network 72 controlling a set of single-pole-double-throw switches determining the path for the ballast resistors and the switching network 74 controlling single-pole-single-throw switches determining the paths for the taps of the output high voltage VOH and for the taps of the output low voltage VOL. The series string of resistors that decrements the reference high voltage RHI to the output high voltage VOH and output low voltage VOL consists of R1, R2, R3, and R4, with equal resistance values. The ballast resistors, consisting of RDUM1, RDUM2, and RDUM3, have equal resistance values. The resistance value of each of the ballast resistors RDUM1, RDUM2, or RDUM3 is equal to the sum of the resistors in the second segment DAC, expressed by the following formula:

RDUM1=RDUM2=RDUM3=ΣResistance of the second segment DAC.

For example, in the 8-Bit second segment DAC, each of the ballast resistors would be equal to the sum of the resistance of the 256 resistors of the 8-Bit second segment DAC. In practice, the value of each of the ballast resistors is slightly higher to account for the small circuit connection resistance encountered in the second segment DAC. Table 1 traces the circuit path for the output high voltage VOH, output low voltage VOL, and the ballast resistors for MSB bits (8,9) values of (1,1), (1,0), (0,1), and (0,0). For example, when the input digital value the MSB bits (8,9) is (1,1), the tap for VOH is created by switching network 74 closing single-pole-single-throw switch SPST31 and the tap for VOL is created by switching network 74 closing the single-pole-single-throw switch SPST30. The output low voltage VOL is tapped after the signal passes through the series resistor R1. Similarly, when the input digital value of MSB bits (8,9) is (1,1), the circuit path for the ballast resistors is determined by switch network 72 activating single-pole-double-throw switches SPDT1, SPDT2, and SPDT3 as listed in Table 1.

The output voltage of the 10-bit DAC is calculated by the following formula:

$$VOUT = D_{INPUT}(RHI - RLOW)/2^N$$

where VOUT is the output voltage of the entire DAC, RHI is the high reference voltage, RLOW is the low reference voltage, N is the number of bits of the input digital signal, and $D_{INPUT}$ is the decimal value of the input digital signal. For example, if the decimal value of the input digital signal of in a 10-Bit DAC is 25, (binary 00000 11001), and (RHI−RLOW) is equal to 5.0000 volts, then VOUT is equal to 0.1221 volts.

The first DAC segment can be a 2, 4, 6, 8, 10 or higher MSB segment DAC. Similarly, the second segment DAC can be a 2, 4, 6, 8, 10, or higher LSB segment DAC of any design and the principles and architecture of the present invention would still apply.

Figure 3:
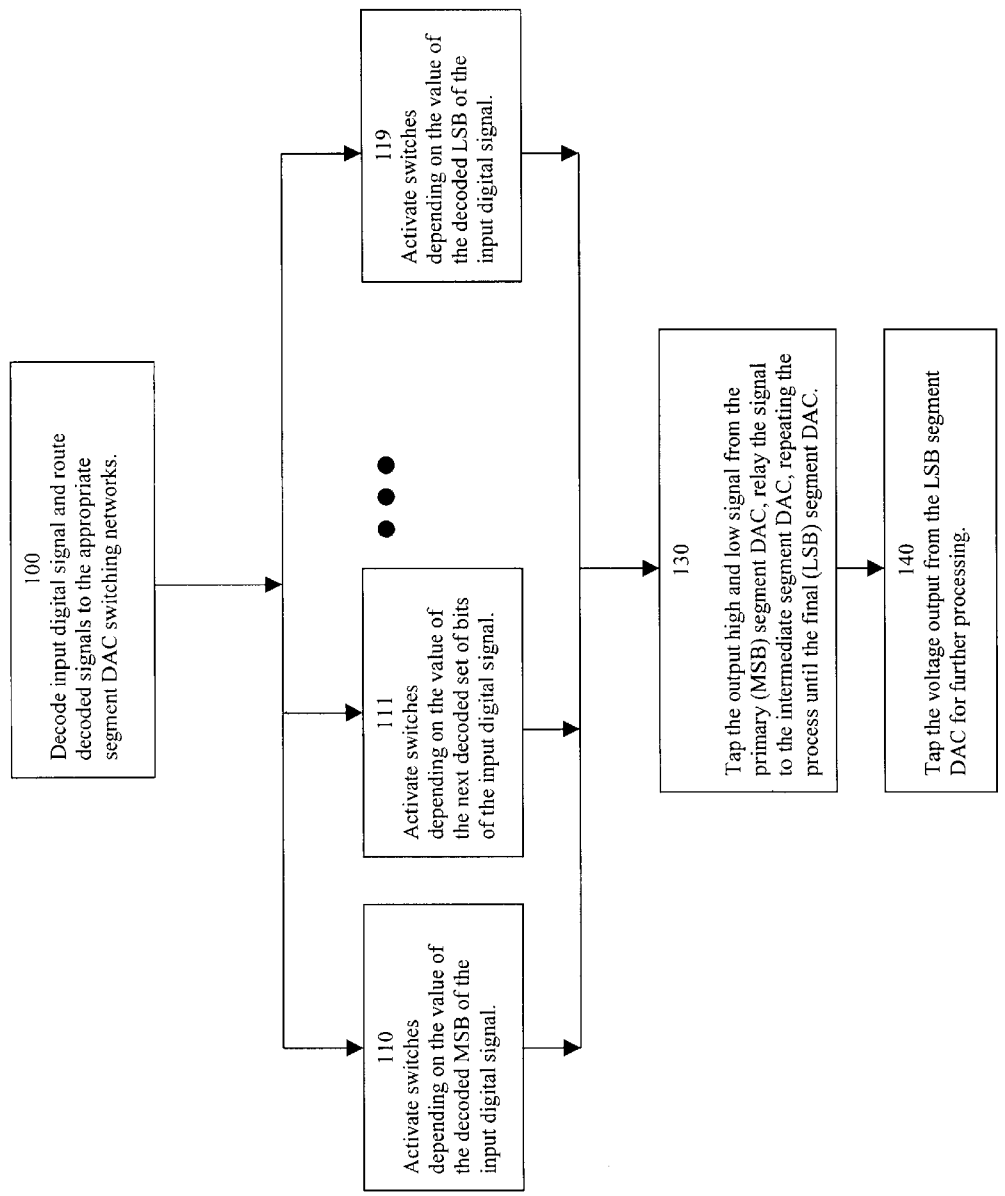
FIG. 3 is a flow chart of the process in the digital-to-analog conversion according to one embodiment of the present invention.

FIG. 3 is a flow chart of the process for an N-bit DAC according to one embodiment of the present invention. The N-bit input digital signal is decoded and the decoded output signals are routed to the appropriate segment DAC switching networks 100. The switches of the MSB segment DAC are activated based on the value of the decoded MSB of the N-Bit input digital signal 110. Concurrently, switches of the next segment DAC are activated based on the value of the decoded next set of bits of the N-Bit input digital signal 111. This process is repeated until the switches of the LSB segment DAC are activated based on the value of the decoded LSB of the N-Bit input digital signal 119. The output high and low signals from the MSB segment DAC are tapped and relayed to the next segment DAC, repeating the process until the output high and low signals are input into the LSB segment DAC 130. The voltage output from the LSB segment DAC is tapped for further processing 140.

Figure 4:
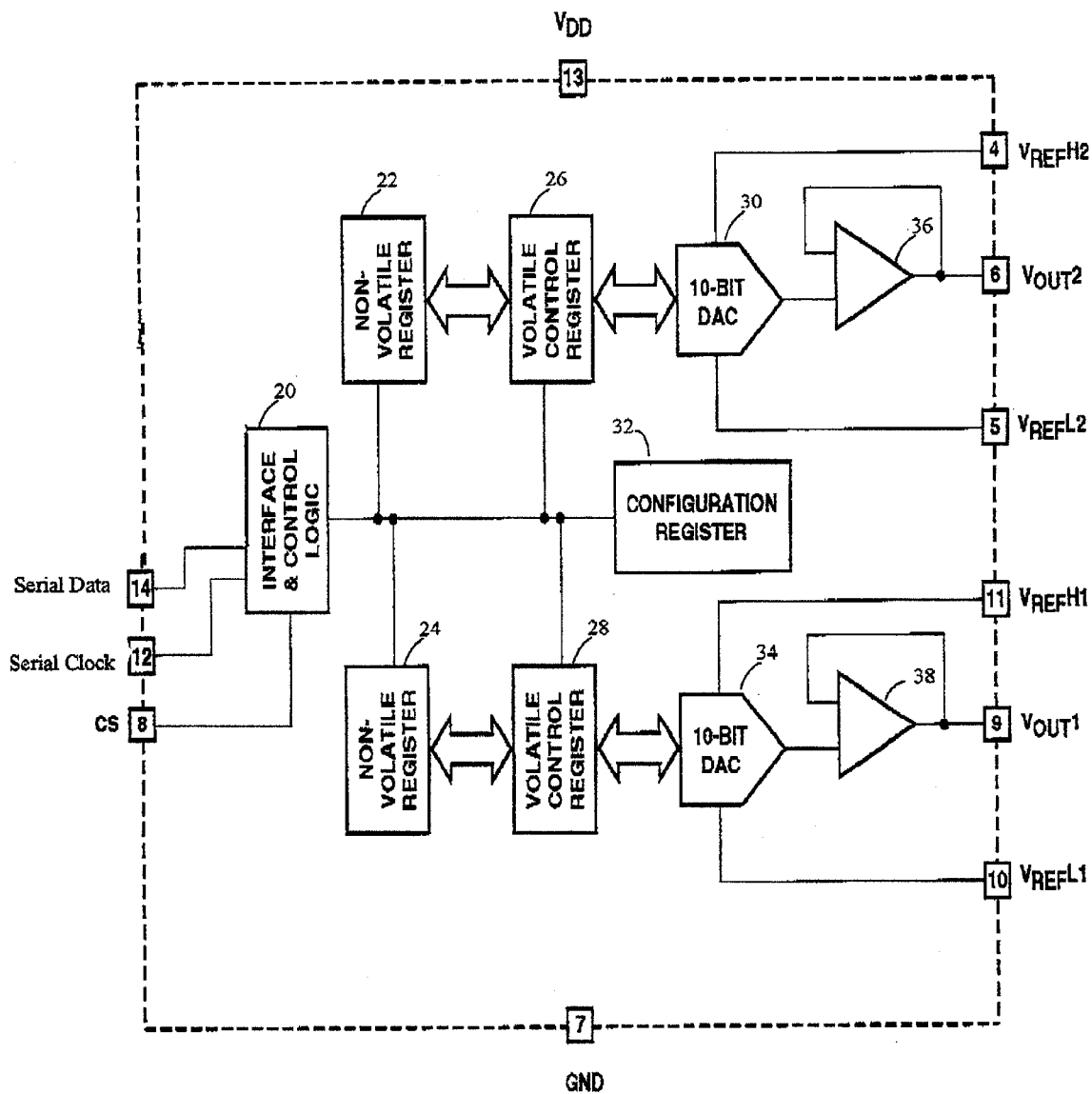
FIG. 4 is an architectural diagram of a dual 10-Bit nonvolatile digital-to-analog converter according to one embodiment of the present invention.

FIG. 4 is an architectural diagram of a serial input, voltage output, dual 10-Bit DAC according to one embodiment of the present invention. The 10-Bit DAC consists of a 2-Bit DAC segment processing the MSB (bits 8 and 9), coupled to an 8-Bit DAC processing the LSB (bits 0−7), of the input 10-bit digital signal. The design of the 10-Bit DAC includes a serial interface and control logic 20 for initial processing of input data for the configuration register 32, for the nonvolatile registers 22, 24, and for processing the input 10-bit digital signal. The serial interface and control logic 20 is an industry standard 2-wire serial interface with coupling for a serial clock 12 and serial data in/out 14. The top 10-Bit DAC 30 has a 10-Bit nonvolatile register 22, a 10-Bit volatile control register 26, and a buffer amplifier 36. The bottom 10-Bit DAC 34 has a 10-Bit nonvolatile register 24, a 10-Bit volatile control register 28, and a buffer amplifier 38. The configuration register=is programmable to set the power-on options to recall a full-scale value, a zero-scale value, a mid-scale value, or a nonvolatile register value. Each of the 10-Bit DACs has the 10-Bit nonvolatile register that can hold a value that can be recalled whenever the device is powered on, based on the setting of the configuration register 32. Each of the 10-Bit DACs has the 10-Bit volatile register that holds the current digital value. In addition, the 10-Bit volatile register can be set to any value by the serial interface and control logic 20; commanded to load the power-on zero-scale, mid-scale, or full-scale value; or commanded to recall a preset value stored in the 10-Bit nonvolatile register. The high and low reference voltages for the top 10-Bit DAC are labeled as $V_{REF}H2$ 4 and $V_{REF}L2$ 5 respectively, while the output voltage is $V_{OUT}2$ 6. The high and low reference voltages for the bottom 10-Bit DAC are labeled as $V_{REF}H1$ 11 and $V_{REF}L1$ respectively, while the output voltage is $V_{OUT}1$ 9. The dual 10-Bit DACs can be operated independently or in tandem.

Other embodiments of the present invention include other configurations where the first segment DAC processes $N_1$ most significant bits of an N-Bit DAC and the subsequent segment DACs process the balance of the bits, $(N-N_1)$, of the N-bit input digital signal. The ballast resistors would function in the same manner to nullify the effect of any imbalance of the resistance on the first segment DAC versus the sum of the resistances in the remaining segment DACs.

Foregoing described embodiments of the invention are provided as illustrations and descriptions. They are not intended to limit the invention to precise form described. In particular, it is contemplated that functional implementation of the invention described herein may be implemented equivalently in hardware, software, firmware, and/or other available functional components or building blocks.

Other variations and embodiments are possible in light of the above teachings, and it is thus intended that the scope of invention not be limited by this Detailed Description, but rather by Claims following.

TABLE 1

PATH OF VOLTAGE OUTPUT HIGH, VOLTAGE OUTPUT LOW & BALLAST RESISTORS FOR THE FIRST SEGMENT CONVERTER

| INPUT DIGITAL BIT (9,8) VALUES | PATH | SWITCHES, TAPS, RESISTORS* |
|---|---|---|
| 1,1 | VOH | RHI, NC1 SPST31, NC4, NC7, NC8, VOH |
|  | VOL | RHI, L1, NC1, R1, RTAP3, SPST30, NC5, NC6, NC9, NC10, VOL |
|  | BALLAST | RHI, L1, NC1, R1, RTAP3, NC2, RDUM3, SPDT3, B3, NC17, NC11, NC12, RDUM2, |

TABLE 1-continued

PATH OF VOLTAGE OUTPUT HIGH, VOLTAGE OUTPUT LOW & BALLAST RESISTORS FOR THE FIRST SEGMENT CONVERTER

| INPUT DIGITAL BIT (9,8) VALUES | PATH | SWITCHES, TAPS, RESISTORS* |
|---|---|---|
| 1,0 | VOH | SPDT2, C2, NC15, RDUM1, SPDT1, C1, G1, RLOW<br>RHI, L1, NC1, R1, RTAP3, SPST21, NC4, NC7, NC8, VOH |
|  | VOL | RHI, L1, NC1, R1, RTAP3, NC2, NC20, R2, NC12, RTAP2, NC13, SPST20, NC6, NC9, NC10, VOL |
|  | BALLAST | RHI, L1, C3, SPDT3, RDUM3, NC2, NC20, R2, NC11, NC12, RDUM2, SPDT2, C2, NC18, RDUM1, SPDT1, C1, G1, RLOW |
| 0,1 | VOH | RHI, L1, NC1, R1, RTAP3, NC2, NC20, R2, NC11, NC12, RTAP2, NC13, SPST11, NC7, NC8, VOH |
|  | VOL | RHI, L1, NC1, R1, RTAP3, NC2, NC20, R2, NC12, RTAP2, R3, RTAP1, NC15, SPST10, NC9, NC10, VOL |
|  | BALLAST | RHI, L1, C3, SPDT3, RDUM3, B2, SPDT2, RDUM2, NC12, RTAP2, R3, NC14, NC18, RDUM1, SPDT1, C1, G1, RLOW |
| 0,0 | VOH | RHI, L1, NC1, R1, RTAP3, NC2, NC20, R2, NC11, NC12, RTAP2, R3, NC14, RTAP1, NC15, SPST01, NC8, VOH |
|  | VOL | RHI, L1, NC1, R1, RTAP3, NC2, NC20, R2, NC11, NC12, RTAP2, R3, NC14, RTAP1, R4, NC16, SPST00, NC10, VOL |
|  | BALLAST | RHI, L1, C3, SPDT3, RDUM3, B2, SPDT2, RDUM2, NC12/NC11, NC17, B1, SPDT1, RDUM1, NC18, R4, NC16, G1, RLOW |

*Origination points, resistors, and termination points are in bold characters.

What is claimed is:

1. A segmented digital-to-analog converter for processing an N-Bit input digital signal comprising:
   a decoder for decoding an input N-bit digital signal into a most-significant-bits set and a least-significant-bits set;
   a first digital-to-analog segment converter including a first set of series resistors, a plurality of ballast resistors, a first set of switching networks for activating the appropriate switches corresponding to the value of the most-significant-bits set, and a first voltage output high and a first voltage output low;
   a second digital-to-analog segment converter including a second set of series resistors, a second set of switching networks for activating the appropriate switches corresponding to the value of the least-significant-bits set, a second input high reference voltage and a second input low reference voltage, and a second voltage output; and
   a high reference voltage source and a low reference voltage source;
   wherein the first high voltage output and the first low voltage output of the first digital-to-analog segment converter connect to the second input high reference voltage and the second input low reference voltage respectively of the second digital-to-analog segment converter, each ballast resistor of the plurality of ballast resistors of the first digital-to-analog segment converter having a resistance value equal to the sum of the resistance values of the second set of series resistors of the second digital-to-analog segment converter, the input N-Bit digital signal is a 10-bit digital signal, the first digital-to-analog segment converter is a 2-Bit digital-to-analog converter and the second digital-to-analog segment converter is an 8-Bit digital-to-analog converter.

2. A segmented digital-to-analog converter for processing an N-Bit input digital signal comprising:
   a decoder for decoding an input N-bit digital signal into a most-significant-bits set and a least-significant-bits set;
   a first digital-to-analog segment converter including a first set of series resistors, a plurality of ballast resistors, a first set of switching networks for activating the appropriate switches corresponding to the value of the most-significant-bits set, and a first voltage output high and a first voltage output low;
   a second digital-to-analog segment converter including a second set of series resistors, a second set of switching networks for activating the appropriate switches corresponding to the value of the least-significant-bits set, a second input high reference voltage and a second input low reference voltage, and a second voltage output; and
   a high reference voltage source and a low reference voltage source;
   wherein the first high voltage output and the first low voltage output of the first digital-to-analog segment converter connect to the second input high reference voltage and the second input low reference voltage respectively of the second digital-to-analog segment converter, each ballast resistor of the plurality of ballast resistors of the first digital-to-analog segment converter having a resistance value equal to the sum of the resistance values of the second set of series resistors of the second digital-to-analog segment converter, the input N-Bit digital signal is a 12-bit digital signal, the first digital-to-analog segment converter is a 4-Bit digital-to-analog converter and the second digital-to-analog segment converter is an 8-Bit digital-to-analog converter.

3. A method of segmented conversion of an N-Bit digital signal to an analog signal, the method comprising:
   decoding an input N-Bit digital signal into a most-significant-bits set and a least-significant-bits set;
   routing the most-significant-bits set into a first digital-to-analog segment converter and the least-significant-bits set to a second digital-to-analog segment converter;
   activating a first set of switches of a switching network of the first digital-to-analog segment converter, the first set of switches being activated corresponding to the value of the most-significant-bits set of the input N-Bit digital signal;

activating a second set of switches of a switching network of the second digital-to-analog segment converter, the second set of switches being activated corresponding to the value of the least-significant-bits set of the input N-Bit digital signal;

tapping an output analog signal at the output voltage tap point of the second digital-to-analog segment converter;

wherein the first digital-to-analog segment converter includes a plurality of ballast resistors, each ballast resistor of the plurality of ballast resistors having a resistance value equaling the sum of the resistance values of all series resistors in the second digital-to-analog segment converter and the first digital-to-analog segment converter having a first high voltage output and a first low voltage output connecting to a second input high reference voltage and a second input low reference voltage of the second digital-to-analog segment converter, respectively, the first digital-to-analog segment converter is a 2-Bit digital-to-analog converter and the second digital-to-analog segment converter is an 8-Bit digital-to-analog converter.

4. A method of segmented conversion of an N-Bit digital signal to an analog signal, the method comprising:

decoding an input N-Bit digital signal into a most-significant-bits set and a least-significant-bits set;

routing the most-significant-bits set into a first digital-to-analog segment converter and the least-significant-bits set to a second digital-to-analog segment converter;

activating a first set of switches of a switching network of the first digital-to-analog segment converter, the first set of switches being activated corresponding to the value of the most-significant-bits set of the input N-Bit digital signal;

activating a second set of switches of a switching network of the second digital-to-analog segment converter, the second set of switches being activated corresponding to the value of the least-significant-bits set of the input N-Bit digital signal;

tapping an output analog signal at the output voltage tap point of the second digital-to-analog segment converter;

wherein the first digital-to-analog segment converter includes a plurality of ballast resistors, each ballast resistor of the plurality of ballast resistors having a resistance value equaling the sum of the resistance values of all series resistors in the second digital-to-analog segment converter and the first digital-to-analog segment converter having a first high voltage output and a first low voltage output connecting to a second input high reference voltage and a second input low reference voltage of the second digital-to-analog segment converter, respectively, the first digital-to-analog segment converter is a 4-Bit digital-to-analog converter and the second digital-to-analog segment converter is an 8-Bit digital-to-analog converter.

5. A dual cascading digital-to-analog converter for processing an N-bit digital signal comprising:

a first cascading digital-to-analog converter including a first cascading decoder for decoding an input N-bit digital signal into a most-significant-bits set and a least-significant-bits set, a first cascading primary segment converter, and a first cascading final segment converter; the first cascading primary segment converter including a first cascading primary segment set of series resistors, a plurality of first cascading ballast resistors, a first cascading primary segment set of switching networks for activating the appropriate switches corresponding to the value of the most-significant-bits set, and a first cascading primary segment voltage output high and a first cascading primary segment voltage output low; the first cascading final segment converter including a first cascading final segment set of series resistors, a first cascading final segment set of switching networks for activating the appropriate switches corresponding to the value of the least-significant-bits set, a first cascading final segment input high reference voltage and a first cascading final segment input low reference voltage, and a first cascading final segment voltage output; the first cascading primary segment voltage output high and the first cascading primary segment voltage output low of the first cascading primary segment converter connecting to the first cascading final segment input high reference voltage and the first cascading final segment input low reference voltage respectively of the first cascading final segment converter and each ballast resistor of the plurality of first cascading ballast resistors of the first cascading primary segment converter having a resistance value equal to the sum of the resistance values of the first cascading final segment set of series resistors of the first cascading final segment converter;

a second cascading digital-to-analog converter including a second cascading decoder for decoding the input N-bit digital signal into a most-significant-bits set and a least-significant-bits set, a second cascading primary segment converter, and a second cascading final segment converter; the second cascading primary segment converter including a second cascading primary segment set of series resistors, a plurality of second cascading ballast resistors, a second cascading primary segment set of switching networks for activating the appropriate switches corresponding to the value of the most-significant-bits set, and a second cascading primary segment voltage output high and a second cascading primary segment voltage output low; the second cascading final segment converter including a second cascading final segment set of series resistors, a second cascading final segment set of switching networks for activating the appropriate switches corresponding to the value of the least-significant-bits set, a second cascading final segment input high reference voltage and a second cascading final segment input low reference voltage, and a second cascading final segment voltage output; the second cascading primary segment voltage output high and the second cascading primary segment voltage output low of the second cascading primary segment converter connecting to the second cascading final segment input high reference voltage and the second cascading final segment input low reference voltage respectively of the second cascading final segment converter and each ballast resistor of the plurality of second cascading ballast resistors of the second cascading primary segment converter having a resistance value equal to the sum of the resistance values of the second cascading final segment set of series resistors of the second cascading final segment converter;

an interface and control logic unit for initial processing of input data for the configuration register, for the non-volatile registers, and for the input N-bit digital signal, a serial data connection coupled to the interface and control logic unit;

a serial clock connection coupled to the interface and control logic unit;

a first cascading nonvolatile register for storing a first cascading value that can be recalled and a second cascading nonvolatile register for storing a second cascading value that can be recalled;

a first cascading volatile register for holding the current digital value or receiving a value as determined by the serial interface and control logic for use in the first cascading digital-to-analog converter and a second cascading volatile register for holding the current digital value or receiving a value as determined by the serial interface and control logic for use in the second cascading digital-to-analog converter;

a configuration register for setting options for the dual cascading digital-to-analog converter, including power-on options;

wherein the input N-Bit digital signal is processed by either the first cascading digital-to-analog converter creating the first cascading final segment voltage output or by the second cascading digital-to-analog converter creating the second cascading final segment voltage output.

6. The dual cascading digital-to-analog converter of claim 5, wherein the power-on options comprise recalling a full-scale power-on value, recalling a zero-scale power-on value, recalling a mid-scale power-on value, or recalling the first cascading nonvolatile register value if the first cascading digital-to-analog converter is being used or the second cascading nonvolatile register value if the second cascading digital-to-analog converter is being used.

* * * * *